US007239069B2

(12) United States Patent
Cho

(10) Patent No.: US 7,239,069 B2
(45) Date of Patent: Jul. 3, 2007

(54) PIEZOELECTRIC TYPE VIBRATOR, IMPLANTABLE HEARING AID WITH THE SAME, AND METHOD OF IMPLANTING THE SAME

(75) Inventor: Jin-Ho Cho, Daegu (KR)

(73) Assignee: Kyungpook National University Industry-Academic Cooperation Foundation, Daegu (KR)

( * ) Notice: Subject to any disclaimer, the term of this patent is extended or adjusted under 35 U.S.C. 154(b) by 0 days.

(21) Appl. No.: 11/243,051

(22) Filed: Oct. 4, 2005

(65) Prior Publication Data

US 2006/0087203 A1 Apr. 27, 2006

(30) Foreign Application Priority Data

Oct. 27, 2004 (KR) ...................... 10-2004-0086161

(51) Int. Cl.
*H01L 41/053* (2006.01)

(52) U.S. Cl. ....................................... 310/348; 310/311

(58) Field of Classification Search ................ 310/348, 310/311
See application file for complete search history.

(56) References Cited

U.S. PATENT DOCUMENTS 5,857,958 A * 1/1999 Ball et al. ...................... 600/25
6,755,778 B2 * 6/2004 Kroll et al. .................... 600/25
2005/0020873 A1 * 1/2005 Berrang et al. ............... 600/25

FOREIGN PATENT DOCUMENTS

| | | |
|---|---|---|
| JP | 10-094093 | 4/1998 |
| JP | 12-184495 | 6/2000 |
| KR | 10-0282066 | 9/2001 |
| KR | 10-0282067 | 9/2001 |

OTHER PUBLICATIONS

"The Envoy® Device", www.envoymedical.com/envoy_device.htm, accessed on Dec. 27, 2005.

* cited by examiner

*Primary Examiner*—Darren Schuberg
*Assistant Examiner*—Derek Rosenau
(74) *Attorney, Agent, or Firm*—Volpe And Koenig P.C.

(57) ABSTRACT

Disclosed herein is a piezoelectric type vibrator included in an implantable hearing device. The piezoelectric type vibrator comprises: a housing; a piezoelectric element portion formed at one end thereof with a free end and at the other end thereof with a non-free end, the piezoelectric element portion being at least partially disposed at the inside of the housing and including at least one piezoelectric element and terminals connected to both ends of the piezoelectric element; and a connection portion attached at one end thereof to one side of the inner wall of the housing and at the other end thereof to a non-free end of the piezoelectric element portion.

19 Claims, 9 Drawing Sheets

PIEZOELECTRIC TYPE VIBRATOR, IMPLANTABLE HEARING AID WITH THE SAME, AND METHOD OF IMPLANTING THE SAME

CROSS-REFERENCES TO RELATED APPLICATIONS

This nonprovisional application claims priority under 35 U.S.C. § 119(a) on Patent Application No. 10-2004-086161 filed in Korea on Oct. 27, 2004, which are hereby incorporated in its entirety by reference.

BACKGROUND OF THE INVENTION

1. Field of the Invention

The present invention relates to a piezoelectric type vibrator, and more particularly to a floating mass-type piezoelectric vibrator having a simple structure, an implantable hearing aid having the same, and a method of implanting the hearing aid.

2. Background of the Related Art

A hearing aid can be classified into a conventional body-worn hearing aid and an implantable hearing aid. The conventional hearing aid has a merit in that it can be easily mounted at an auricle and/or an acoustic pore of an external ear. However, the conventional hearing aid also has a demerit in that it does not satisfy a performance specification required for those who have more than severe hearing loss. The implantable hearing aid is suited for individuals with such severe hearing impairment. Such an implantable hearing aid can be divided into an implantable middle ear hearing device (IMEHD) and an implantable inner ear hearing device (cochlear implant).

The implantable middle ear hearing device typically includes a microphone and a vibrator. The research on the implantable middle ear hearing device is conducted intensively in view of the fact that it can effectively transfer a sound signal to persons who have sensorineural hearing loss because of its simple structure.

A human's ear is divided into three parts: external ear, middle ear and inner ear. An external sound is transmitted to the brain in the form of sound wave signal while sequentially passing through these three ear parts. Among these ear parts, the middle ear includes a tympanic membrane, a tympanic cavity and an auditory ossicle that consists of three small bones known as malleus, an incus and stapes. A vibrator for the implantable middle ear hearing device is mounted at the auditory ossicle so that it transmits an external audio signal to the inner ear as an acoustic vibration signal.

Such a vibrator for the implantable middle ear hearing device can be classified into an electromagnetic-transducer type one and a piezoelectric type one.

As one example of a conventional electromagnetic-transducer type vibrator, the Korean patent Nos. 282066 and 282067 disclose an electronic transducer for hearing aids implanted in the middle ear, in which vibration is generated by using an electromagnetic repulsive force caused by a coil and a magnet.

FIG. 1 illustrates one example of an electromagnetic-transducer type vibrator according to the prior art. As shown in FIG. 1, the electromagnetic-transducer type vibrator 1 includes a case 10, a coil 30 arranged at the inside of the case 10, a pair of magnets 20*a* and 20*b* disposed within the case 10 in such a fashion that the magnets are partially surrounded by the coil 30, a pair of elastic members 40*a* and 40*b* each connected at one end thereof to the inner wall of the case 10 and connected at the other end thereof to one side of each of the magnets 20*a* and 20*b*. In this case, the magnets 20*a* and 20*b* are aligned such that identical magnetic poles thereof are opposite one another. When an acoustic current signal corresponding to an acoustic signal is applied to the coil 40 from the outside, the magnets 20*a* and 20*b* are vibrated in the transverse axial direction of the electromagnetic-transducer type vibrator owing to the interaction between the coil 30 and the magnets 20*a* and 20*b*. This vibration is transmitted to the case 10 through the elastic members 40*a* and 40*b*, which is in turn transmitted to the auditory ossicle at which the electromagnetic-transducer type vibrator is mounted. At this time, the auditory ossicle delivers an acoustic vibration signal to an auditory nerve cell. Such an electromagnetic-transducer type vibrator has an advantage in that since it is configured in a floating mass type, its installation is easy. That is, the electromagnetic-transducer type vibrator is mounted at the auditory ossicle by means of a clamping member like a clip as an external constitutional element, and hence its easy installation is possible. However, the electromagnetic-transducer type vibrator also has a problem in that it is not easy to manufacture since it includes complicated elements such as magnets aligned such that their identical poles are opposed to one another, a coil, a membrane, etc.

On the contrary, the piezoelectric type vibrator has a merit in that it is easy for accomplishing a desired purpose through relatively simple constitutional elements such as a lead wire for transmitting an external acoustic current signal to the inner ear, electrodes connected to the lead wire, a piezoelectric element disposed between the electrodes, etc. The piezoelectric type vibrator also has an advantage in that it is excellent in an acoustic vibration transmitting efficiency unlike the electromagnetic-transducer type vibrator having the magnets and the coil.

However, the conventional piezoelectric type vibrator also has a demerit in that it is difficult to mount. That is, in order to transmit the vibration generated from the piezoelectric type vibrator to the auditory ossicle, the vibrator must be fixedly connected at one end thereof to a certain region within the ear. For example, in case of a vibrator embedded in the Envoy® middle ear implantable system manufactured by St. Croix Medical Inc., the vibrator is mounted at one end thereof to one side of the tympanic bone and abuts the other end thereof against the auditory ossicle so that an acoustic vibration signal is transmitted to the auditory ossicle in response to the vibration of an piezoelectric element. However, such a conventional piezoelectric type vibrator still has a problem in that its mechanical construction is complicated which is designed for allowing an appropriate pressure to be maintained at the contact portions at the time of mounting one end of the vibrator to the tympanic bone and connecting its other end to the auditory ossicle, as well as allowing an otolaryngologist to easily perform the hearing aid implantation operation in a short time period.

SUMMARY OF THE INVENTION

Accordingly, the present invention has been made to address and solve the above-mentioned problems occurring in the prior art, and it is an object of the present invention to provide an piezoelectric type vibrator which is implemented in a floating mass type by using a structure which is simply manufactured and constructed, and is easily mounted.

To accomplish the above object, according to one aspect of the present invention, there is provided a piezoelectric type vibrator, comprising: a housing; a piezoelectric element portion formed at one end thereof with a free end and at the other end thereof with a non-free end, the piezoelectric element portion being at least partially disposed inside of the housing and including at least one piezoelectric element and terminals connected to both ends of the piezoelectric element; and a connection portion attached at one end thereof to one side of the inner wall of the housing and at the other end thereof to a non-free end of the piezoelectric element portion.

The piezoelectric element portion of the piezoelectric type vibrator according to the present invention may include one or more piezoelectric elements, and the piezoelectric elements may be connected with one another in series so that maximization of a volume change is caused to thereby maximize a vibration effect.

The connection portion of the piezoelectric type vibrator according to the present invention may comprise a contact part attached to the non-free end of the piezoelectric element portion, a mounting part attached to one side of the inner wall of the housing, and a support part connecting and supporting the contact part and the mounting part, so that vibration frequency characteristics can be optimized by appropriately combining the design specifications for respective constituent elements.

According to another aspect of the present invention, there is also provided a piezoelectric type vibrator, comprising: a housing opened at one side thereof and formed at least partially on the circumferential surface thereof with an engagement member; and a piezoelectric element portion of which one end protrudes outwardly from the opened side of the housing to form a free end, and the other end is positioned inside of the housing to form a non-free end, the piezoelectric element portion including at least one piezoelectric element and terminals connected to both ends of the piezoelectric element.

According to yet another aspect of the present invention, there is also provided an implantable hearing device comprising: a microphone disposed at a tympanic bone for receiving an acoustic signal from the outside; a controller for receiving the acoustic signal from the microphone to convert the received acoustic signal into an acoustic electrical signal to generate a control signal; and a piezoelectric type vibrator including a housing, a piezoelectric element portion formed at one end thereof with a free end and at the other end thereof with a non-free end, the piezoelectric element portion being at least partially disposed inside of the housing and including at least one piezoelectric element and terminals connected to both ends of the piezoelectric element, and a connection portion attached at one end thereof to one side of the inner wall of the housing and at the other end thereof to a non-free end of the piezoelectric element portion, the piezoelectric type vibrator being adapted to generate an acoustic vibration signal to activate the piezoelectric element portion in response to the control signal from the controller.

According to a further aspect of the present invention, there is also provided an implantable hearing device comprising: a microphone disposed at a tympanic bone for receiving an acoustic signal from the outside; a controller for receiving the acoustic signal from the microphone to convert the received acoustic signal into an acoustic electrical signal to generate a control signal; and a piezoelectric type vibrator including a housing opened at one side thereof and formed at least partially on the circumferential surface thereof with an engagement member, and a piezoelectric element portion of which one end protrudes outwardly from the opened one side of the housing to form a free end and the other end is positioned at the inside of the housing to form a non-free end, the piezoelectric element portion including at least one piezoelectric element and terminals connected to both ends of the piezoelectric element, the piezoelectric type vibrator being adapted to generate an acoustic vibration signal to activate the piezoelectric element portion in response to the control signal from the controller.

According to a still further aspect of the present invention, there is also provided method of implanting a piezoelectric type vibrator, the method comprising the steps: forming a mounting hole at a round window of a cochlear; providing a piezoelectric type vibrator which includes: a housing opened at one side thereof and formed at least partially on the circumferential surface thereof with an engagement member; and a piezoelectric element portion of which one end protrudes outwardly from the opened side of the housing to form a free end and the other end is positioned inside of the housing to form a non-free end, the piezoelectric element portion including at least one piezoelectric element and terminals connected to both ends of the piezoelectric element; disposing the piezoelectric type vibrator at an inlet of the round window such that the opened one side of the housing is oriented toward the inlet of the round window; and detecting an electrical signal output from the piezoelectric element portion, and inserting the piezoelectric type vibrator into the round window until the detected electrical signal reaches a preset value.

BRIEF DESCRIPTION OF THE DRAWINGS

The above and other objects, features and advantages of the present invention will be become more apparent from the following detailed description of the preferred embodiments of the invention in conjunction with the accompanying drawings, in which.

DETAILED DESCRIPTION OF THE PREFERRED EMBODIMENT

Reference will now be made in detail to the preferred embodiment of the present invention with reference to the attached drawings.

Figure 1:
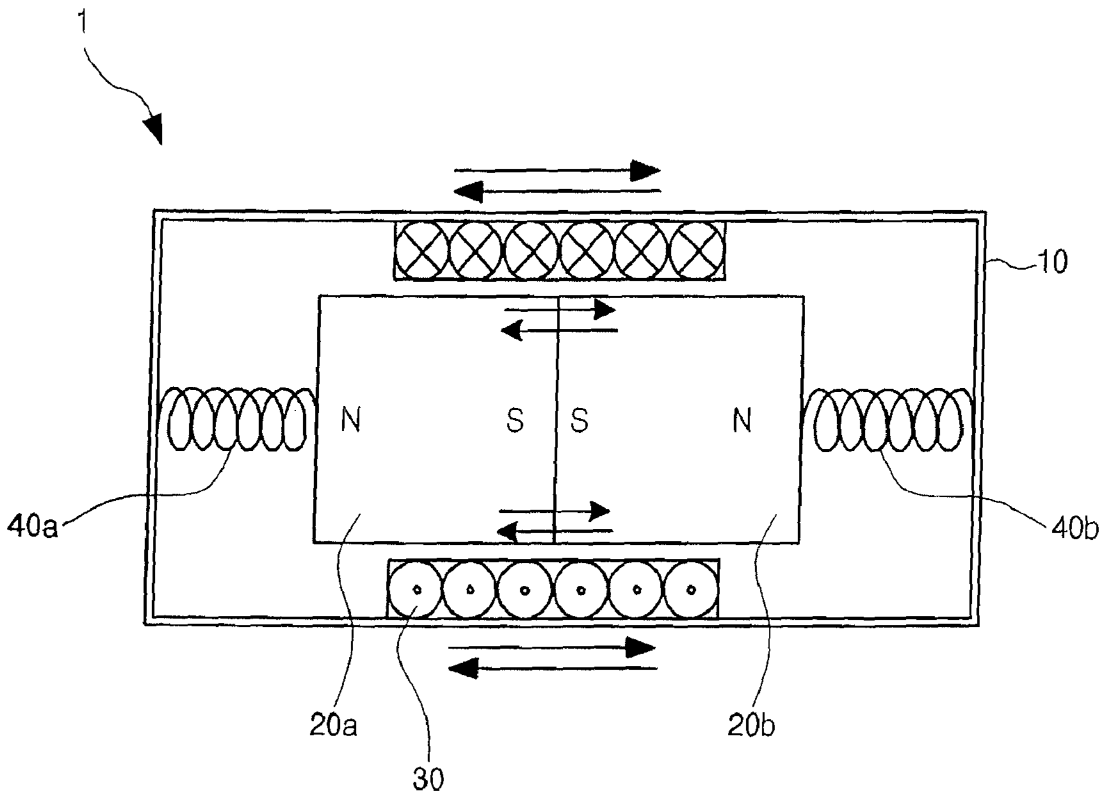
Fig 1 Prior art
FIG. 1 is a schematic cross-sectional view illustrating an electromagnetic-transducer type vibrator according to the prior art.
Figure 2A:
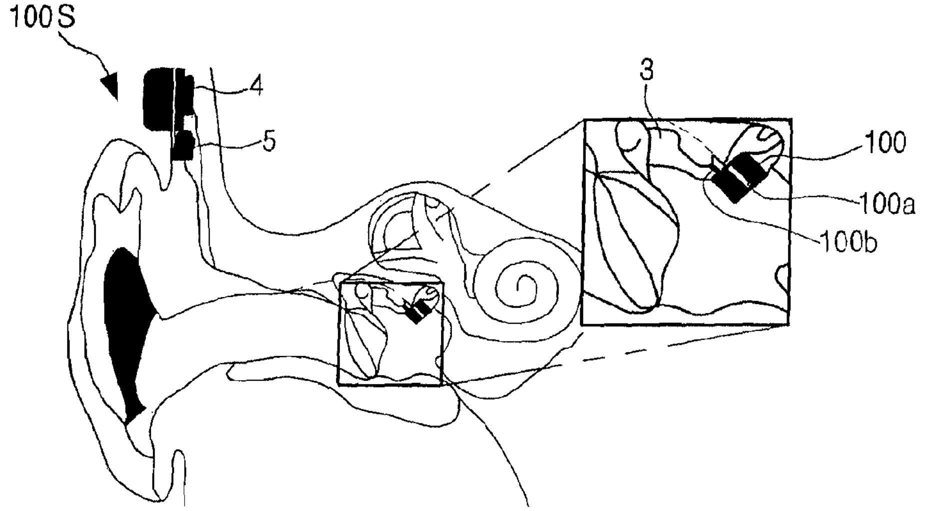
FIG. 2*a* is a schematic view illustrating an arrangement state in which an implantable hearing device is embedded in the middle ear according to the present invention.

FIG. 2*a* illustrates a schematic arrangement view of a piezoelectric type vibrator and an implantable middle ear hearing device with the piezoelectric type vibrator according to the present invention.

As shown in FIG. 2*a,* the implantable hearing device 100*s* includes a microphone 4 for receiving an acoustic signal from the outside, a controller 5 for receiving the acoustic signal from the microphone 4 to generate an acoustic electrical signal, and a piezoelectric type vibrator 100 for generating an acoustic vibration signal in response to the acoustic electrical signal from the controller 5. A vibrator mounting portion 100*a* provided at an outer side of the piezoelectric type vibrator 100 is mounted at an auditory ossicle 3 by means of a clamping member 100*b* like a clip.

Figure 2B:
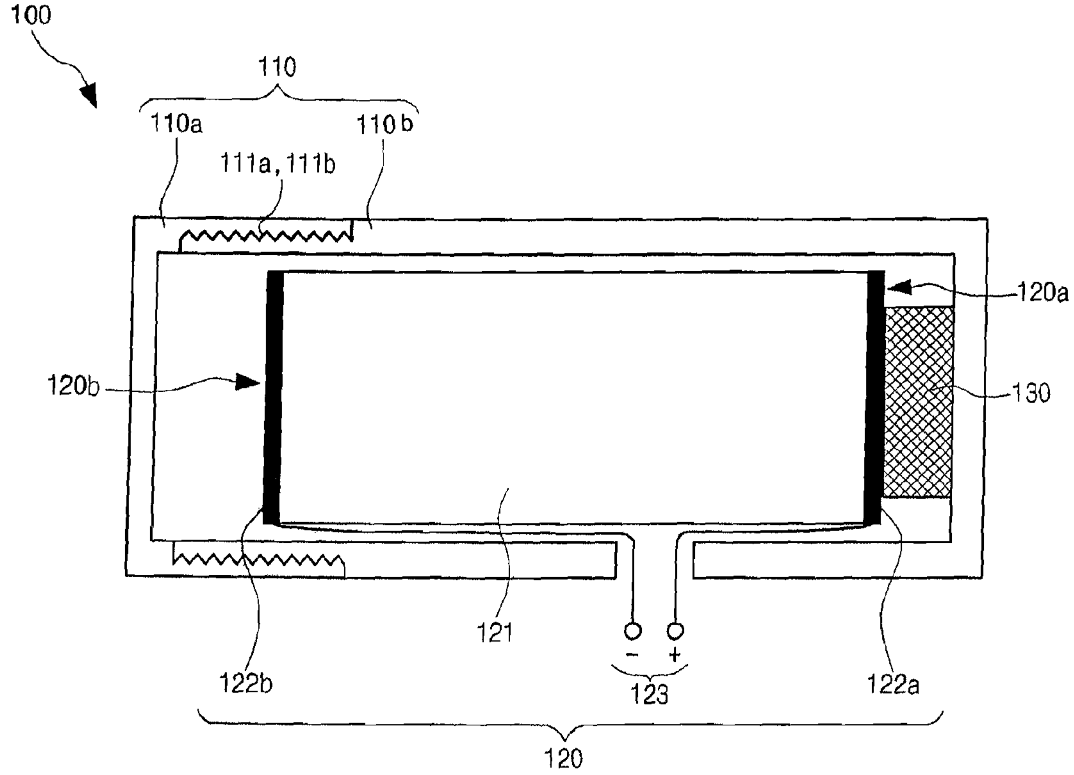
FIG. 2*b* is a schematic cross-sectional view illustrating a piezoelectric type vibrator for the implantable middle ear hearing device according to a first embodiment of the present invention.

FIG. 2*b* is a schematic cross-sectional view illustrating a piezoelectric type vibrator for the implantable middle ear hearing device according to a first embodiment of the present invention.

Referring to FIG. 2*b*, the piezoelectric type vibrator includes a cylindrical housing 110, a piezoelectric element portion 120 and a connecting portion 130.

The housing 110 includes a housing cover 110*a* and a housing body 110*b* that define an internal space for accommodating the piezoelectric element portion 120 and the connecting portion 130 therein. The coupling portion between the housing cover 110*a* and the housing body 110*b* is provided with a male screw part 111*a* formed on the outer circumferential surface of the housing body 110*b* and a female screw part 111*b* formed on the inner circumferential surface of the housing cover 110*a*. Also, although the housing 110 is configured in a cylindrical shape in which its longitudinal axis corresponds to an axis parallel with a direction where the piezoelectric element portion 120 and the connection portion 130 are arranged, it is not limited thereto but may be configured in various shapes.

In addition, the housing 110 is made of a variety of materials, but is preferably made of a material that can minimize a rejection reaction in the human body, particularly titanium, in case of metal material.

The piezoelectric element portion 120 is disposed inside the housing 110. The piezoelectric element portion 120 is composed of at least one piezoelectric element 121 and electrodes 122*a* and 122*b* each connected to both ends 120*a*, 120*b* of the piezoelectric element 121, respectively. The piezoelectric element 121 may be made of crystal, barium titanate ($BaTiO_3$), and Plumbum-Zirconate-Titanate (PZT) depending on the occasion. At both ends 120*a,* 120*b* of the piezoelectric element 121 is disposed electrodes 122*a* and 122*b,* which are connected to terminals 123 by means of lead wires extending via a through-hole formed at one side of the housing 110. The terminals are connected to an electrical component outside of the housing 110, that is, the controller 4 (see FIG. 2A) for generating an electrical signal for application to the piezoelectric type vibrator 100 to control the piezoelectric type vibrator 100, so that the electrical signal applied to piezoelectric type vibrator 100 from the controller 4 is delivered to the piezoelectric element 121 of the piezoelectric element portion 120 located inside the housing 110 through electrodes 122*a* and 122*b* via the lead wires to thereby cause a change in the volume of the piezoelectric element 121.

The connection portion 130 is disposed inside the housing 130 in such a fashion that it is attached at one end thereof to one side of the inner wall of the housing 110 and at the other end thereof to one end 120*a* of the piezoelectric element portion 120, i.e., a non-free end of the piezoelectric element portion 120. In this case, the other end 120*b* of the piezoelectric element portion 120 is formed with a free end so that any interference from other constituent elements is excluded. The connection portion 130 may include an elastic member, which is a high molecular compound such as rubber, silicon rubber, polyimide, etc. The connection portion 130 may be formed of a single body or plural individual bodies, and may be also formed in a coin shape or a hexahedral shape. In this manner, the connection portion 130 can be variously configured depending on the design specifications.

As described above, for the piezoelectric type vibrator 100 including the housing 110, the piezoelectric element portion 120 and the connection 130, in order to minimize a user's physical burden when the vibrator is implanted into his or her body, it is preferred that the housing 110 has an effective diameter of less than 1.8 mm and a longitudinal axial length of less than 2 mm, and the piezoelectric type vibrator 100 has a total weight of 50 mg or less. But the piezoelectric type vibrator must be appropriately set to have a vibration width of a maximum of 1 μm or so in order to optimize a user's use sensitivity.

The operating principle of the piezoelectric type vibrator according to a first embodiment of the present shown invention will be described hereinafter with reference to FIG. 2*b*.

Figure 2C:
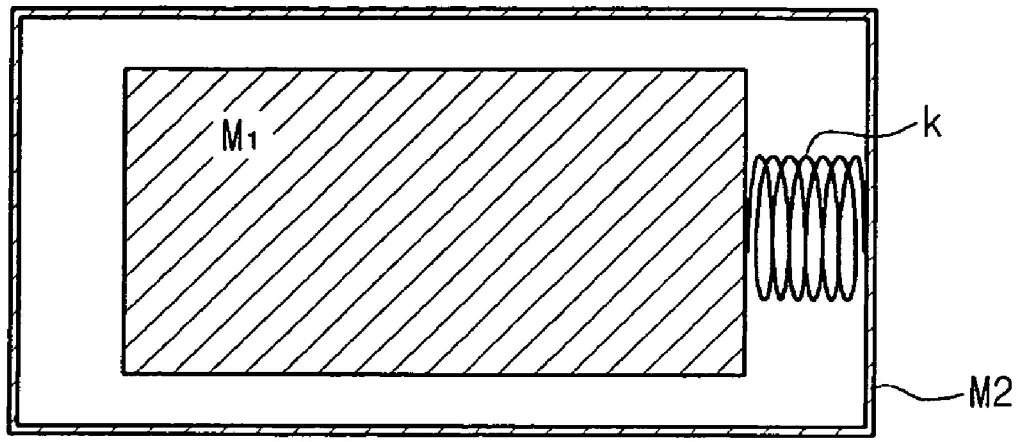
FIG. 2*c* is a schematic modeling diagram illustrating the piezoelectric type vibrator of FIG. 2*b;*

FIG. 2*c* illustrates a structural modeling diagram in which the piezoelectric type vibrator of FIG. 2*b* is schematized.

Referring to FIG. 2*c*, the piezoelectric type vibrator according to the first embodiment of the present invention can be structurally schematized in such a fashion that the housing 110 is a mass body ($M_2$) having a mass of $M_2$, the connection portion 130 is a spring R having a spring constant of k, and the piezoelectric element portion 120 is a mass body $M_1$ which has a mass of $M_1$ and is formed at one end thereof with a free end.

Figure 2D:
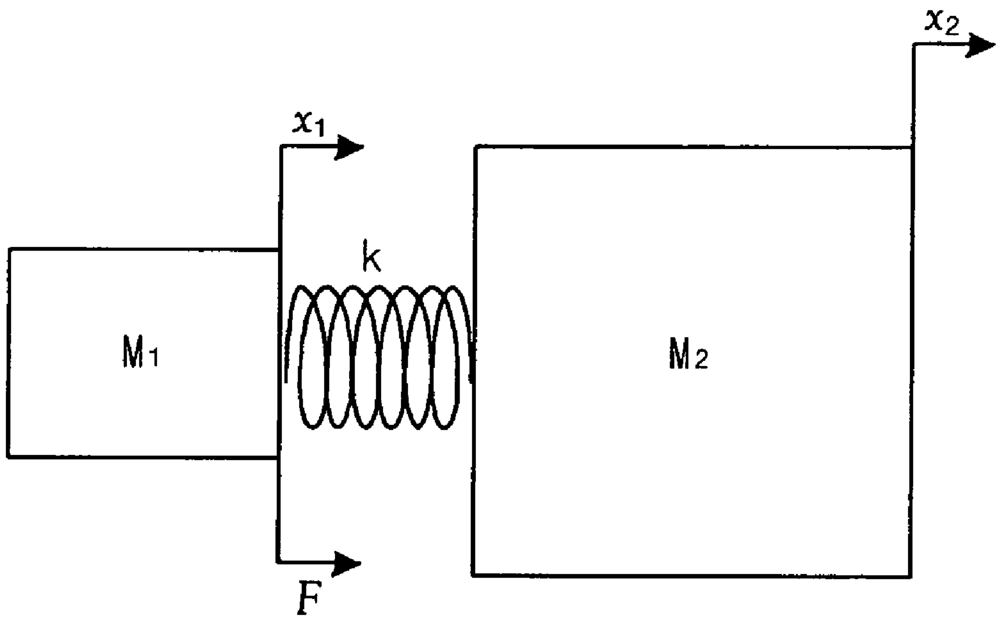
FIG. 2*d* is a schematic modeling diagram for a mathematical modeling of the piezoelectric type vibrator of FIG. 2*b;*

The structural modeling diagram of the piezoelectric vibrator shown in FIG. 2*c* can be modeled into a piezoelectric vibrator having first and second mass bodies $M_1$ and $M_2$ which are connected to each other by means of a spring R as shown in FIG. 2*d*. Here, F represents a force generated due to a drive voltage applied to a laminated-type piezoelectric element portion, and $x_1$ and $x_2$ denote the vibration displacement of respective mass bodies $M_1$ and $M_2$.

For the first mass body $M_1$, the following equation can be obtained:

$$M_1\ddot{x}_1+k(x_1-x_2)=F$$

For the second mass body $M_2$, the following equation can be obtained:

$$M_2\ddot{x}_2+k(x_2-x_1)=0$$

The above-mentioned differential equations can be rewritten as follows:

$$x_j = X_j e^{i\omega t}$$

$$F = F_o e^{i\omega t}$$

$$\begin{bmatrix} -M_1\omega^2+k & -k \\ -k & -M_2\omega^2+k \end{bmatrix}\begin{bmatrix} X_1 \\ X_2 \end{bmatrix} = \begin{bmatrix} F_o \\ 0 \end{bmatrix}$$

$$\begin{vmatrix} -M_1\omega^2+k & -k \\ -k & -M_2\omega^2+k \end{vmatrix} = 0$$

$$(M_1\omega^2-k)(M_2\omega^2-k)-k^2=0$$

$\omega=\omega_0$ derived from the characteristic equations of the differential equations is an eigen value, which corresponds to a natural frequency ($\omega_0$) of the piezoelectric type vibrator according to the first embodiment of the present invention.

Figure 3:
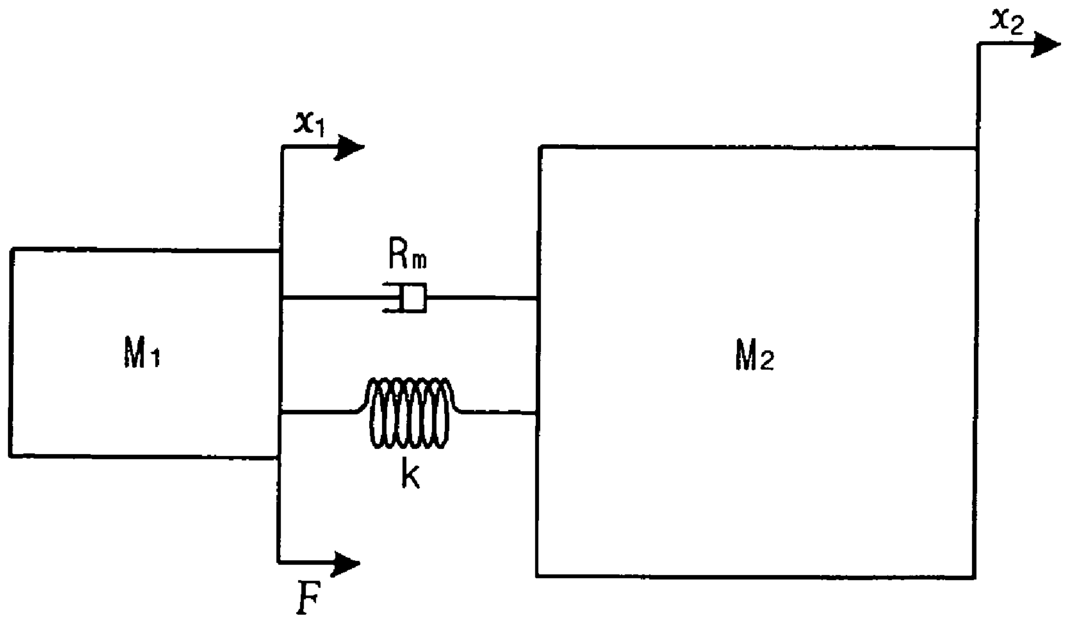
FIG. 3 is a schematic modeling diagram for another mathematical modeling of the piezoelectric type vibrator.

In the meantime, in view of loss components for the purpose of implementing a more accurate mathematical modeling approach for the piezoelectric type vibrator according to the first embodiment of the present invention, the piezoelectric type vibrator can be modeled as shown in FIG. 3. That is, a damper component Rm may be added as a damper indicative of a loss component besides an elastic condition taken into consideration between two mass bodies $M_1$ and $M_2$. In this case, the force equation for the first and second mass bodies $M_1$ and $M_2$ is derived as follows:

$$M_1\ddot{x}_1+k(x_1-x_2)+R_m(\dot{x}_1-\dot{x}_2)=F$$

$$M_2\ddot{x}_2+k(x_2-x_1)+R_m(\dot{x}_2-\dot{x}_1)=0$$

These differential equations can be rewritten as follows:

$$x_j = X_j e^{i\omega t}$$

$$F = F_o e^{i\omega t}$$

$$\begin{bmatrix} -M_1\omega^2+R_m\omega i+k & -(R_m\omega i+k) \\ -(R_m\omega i+k) & -M_2\omega^2+R_m\omega i+k \end{bmatrix}\begin{bmatrix} X_1 \\ X_2 \end{bmatrix} = \begin{bmatrix} F_o \\ 0 \end{bmatrix}$$

$$\begin{vmatrix} -M_1\omega^2+R_m\omega i+k & -(R_m\omega i+k) \\ -(R_m\omega i+k) & -M_2\omega^2+R_m\omega i+k \end{vmatrix} = 0$$

$$(M_1\omega^2-R_m\omega i-k)(M_2\omega^2-R_m\omega i-k)-(R_m\omega i+k)^2=0$$

$\omega=\omega_0$ derived from the characteristic equations of the differential equations is an eigen value, which corresponds to a natural frequency ($\omega_0$) of the piezoelectric type vibrator according to the first embodiment of the present invention, in which a damper as a loss component is taken into consideration.

The above mathematical modeling is an example of a design process for finding out an optimum point of the piezoelectric type vibrator having the structure according to the first embodiment or the present invention. The present invention is not limited to the above mathematical modeling, but may implement a simper or more complicated mathematical modeling approach as well as enables various mathematical interpretations within the scope of the structure according to the first embodiment of the present invention.

The piezoelectric type vibrator 100 preset depending on the design specification by such mathematical modeling constitutes the implantable hearing device along with the microphone 4 and the controller 5. The piezoelectric type vibrator 100 is mounted at a user's middle ear, particularly the auditory ossicle 3 of the middle ear. At the outer surface of the housing 110 constituting the piezoelectric type vibrator 100 may be formed a housing connection portion (not shown) for attaching the piezoelectric type vibrator 100 to the auditory ossicle 3. The housing 110 may include its own connection member, and, for example, may allow the piezoelectric type vibrator 100 to be attached to the auditory ossicle through other clamping member such as a clip (see FIG. 2A). The auditory ossicle 3 consists of malleus, incus and stapes. The piezoelectric type vibrator 100 is preferably attached to the incus in view of the fact that the malleus is connected to the tympanic membrane, and the stapes delivers an acoustic vibration signal to the auditory nerve cells. At this time, it is preferred that a movement direction of the incus and the longitudinal direction, i.e., the vibration direction of the piezoelectric type vibrator 100 are identical to each other in the process where sound is sequentially transmitted to malleus, incus and stapes via the tympanic membrane.

At a user's tympanic bone are disposed a microphone 4 (see FIG. 2*a*) for receiving a sound signal from the outside and a controller 5 for receiving the sound signal from the microphone 4 so as to convert the received sound signal into an acoustic electrical signal for application to the piezoelectric type vibrator. At this time, the acoustic electrical signal, i.e., a control signal generated from the controller 5 is transmitted to the terminals 123 of the piezoelectric type vibrator 100. At this time, the electrical signal applied to the terminals 123 is transmitted to the piezoelectric element 121 through the electrodes 122*a* and 122*b* so that the piezoelectric element 121 is expanded and/or contracted. Such a volume change of the piezoelectric element is delivered to the housing 110 through the connection portion 130, and then the incus of the auditory ossicle 3 where the housing 110 of the piezoelectric type vibrator 100 is attached reciprocates so that the stapes connected to the incus transmits an acoustic vibration signal to the auditory nerve cells to thereby allow a user to recognize an external sound stimulus.

Figure 4:
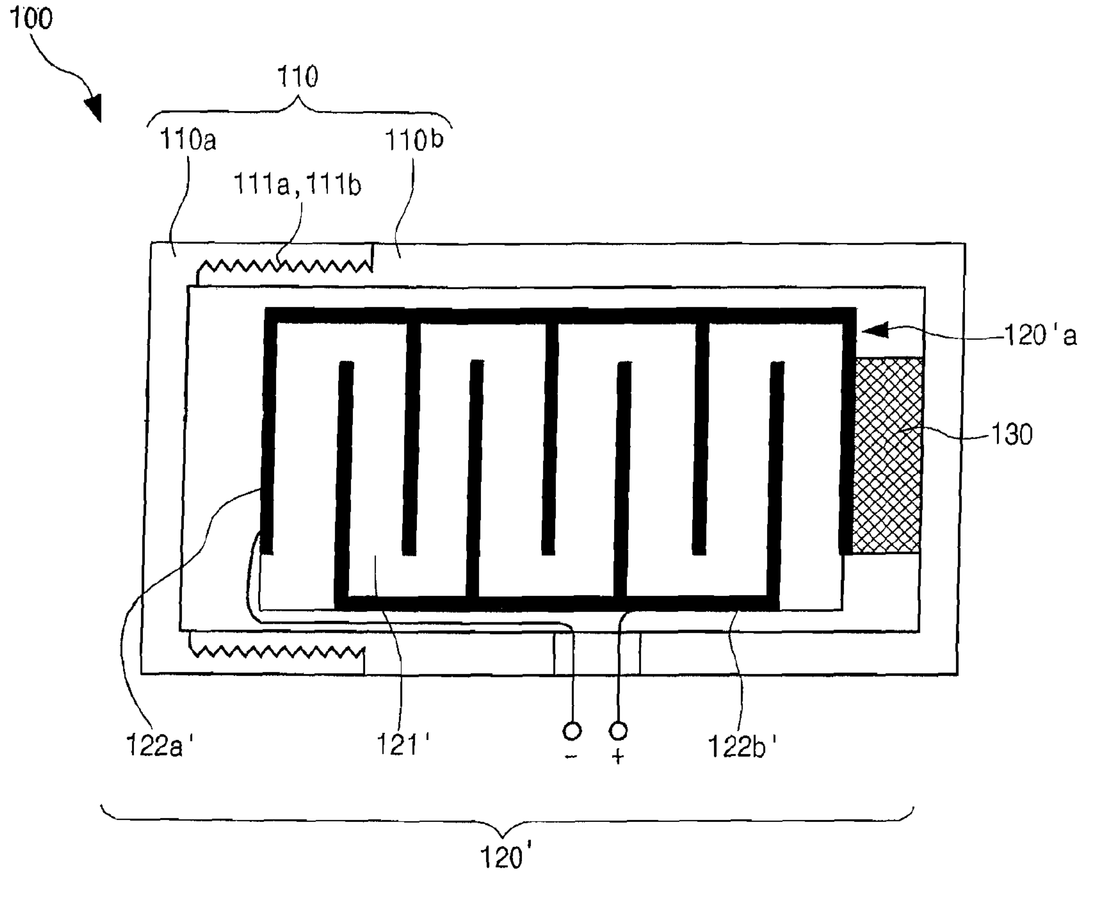
FIG. 4 is a schematic cross-sectional view illustrating a piezoelectric type vibrator for the implantable middle ear hearing device according to a second embodiment of the present invention.

In the meantime, while the first embodiment of the present invention has described the piezoelectric type vibrator having a single piezoelectric element, the present invention is not limited thereto. According to a second embodiment of the present invention, the piezoelectric element included in the piezoelectric element portion may be formed in plural numbers. That is, as shown in FIG. 4, the piezoelectric element portion 120' includes a plurality of piezoelectric elements 121' which may be connected with in series. At this time, for the plurality of piezoelectric elements 121', the same kind of piezoelectric elements are preferably used, but the present invention is not limited thereto.

The plurality of piezoelectric elements 121' may be connected with one another in series whereas electrodes 122*a'* and 122*b'* connected to the respective piezoelectric elements 121' may be connected with one another in parallel. In the case where the same voltage is applied to a single piezoelectric element 121 (see FIG. 2*b*) having a length of L and a plurality (n) of piezoelectric elements which are formed by dividing the single piezoelectric element 121 into n equal parts and are serially connected with one another while electrodes connected to the n piezoelectric elements being parallely connected with one another, the n piezoelectric elements serially connected can accomplish the displacement multiplication effect $n^2$ times that of the single piezoelectric element 121.

Figure 5:
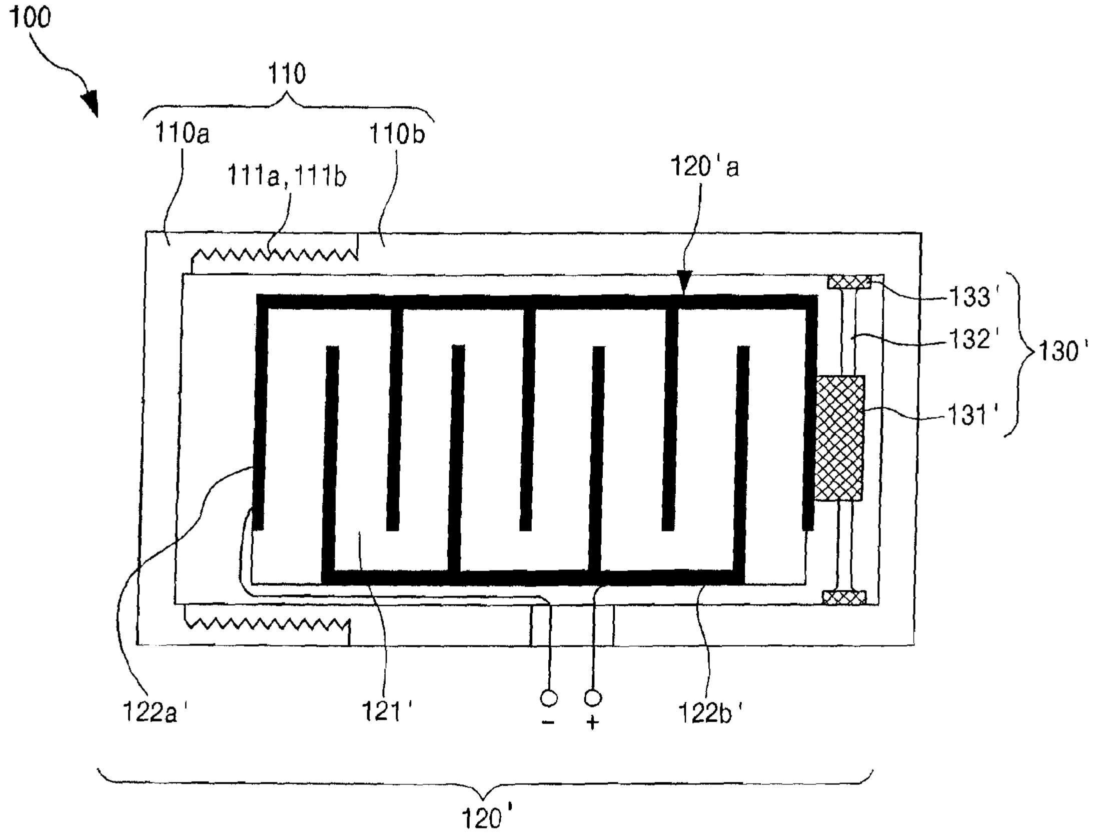
FIG. 5 is a schematic cross-sectional view illustrating a piezoelectric type vibrator for the implantable middle ear hearing device according to a third embodiment of the present invention.

In the meantime, in a third embodiment of the present invention, in order for the piezoelectric element to more accurately transmit an acoustic vibration signal output therefrom to the auditory ossicle, the connection portion for connecting the piezoelectric element and the housing to each other may take a structure as shown in FIG. 5.

The connection portion 130" includes a contact part 131", a support part 132" and a mounting part 133". The contact part 131" is formed in a coin shape, and is attached at one side thereof to a non-free end of the piezoelectric element portion 120' (see FIG. 6A) and is attached at the other side thereof to the support part 132". The support part 132" is formed in a wheel shape and includes a hub 132"*a* positioned at the center thereof, an outer rim 132"*c* concentric with the hub 132"*a,* and a plurality of spokes 132"*b* arranged radially around the hub in such a fashion that opposite ends of each spoke 132"*b* are secured to the hub 132"*a* and the rim 132"*c*, respectively, for connecting the hub 132"*a* and the outer rim 132"*c* to each other. The support part 132" may be formed to a thickness of 0.1 mm or so through a microelectric mechanical system (MEMS).

At least one of the contact part 131', the mounting part 133' and the support part 132' may include an elastic member. The elastic member may be made of a high molecular compound such as rubber, polyimide, etc., and made of various materials. Also, these three parts are formed of an elastic member, and at least one of them may be formed of a material having a different elastic coefficient. That is, the support part 132' may be formed of a material having an elastic coefficient greater than that of the contact part 131' and the mounting part 133'.

Figure 6A:
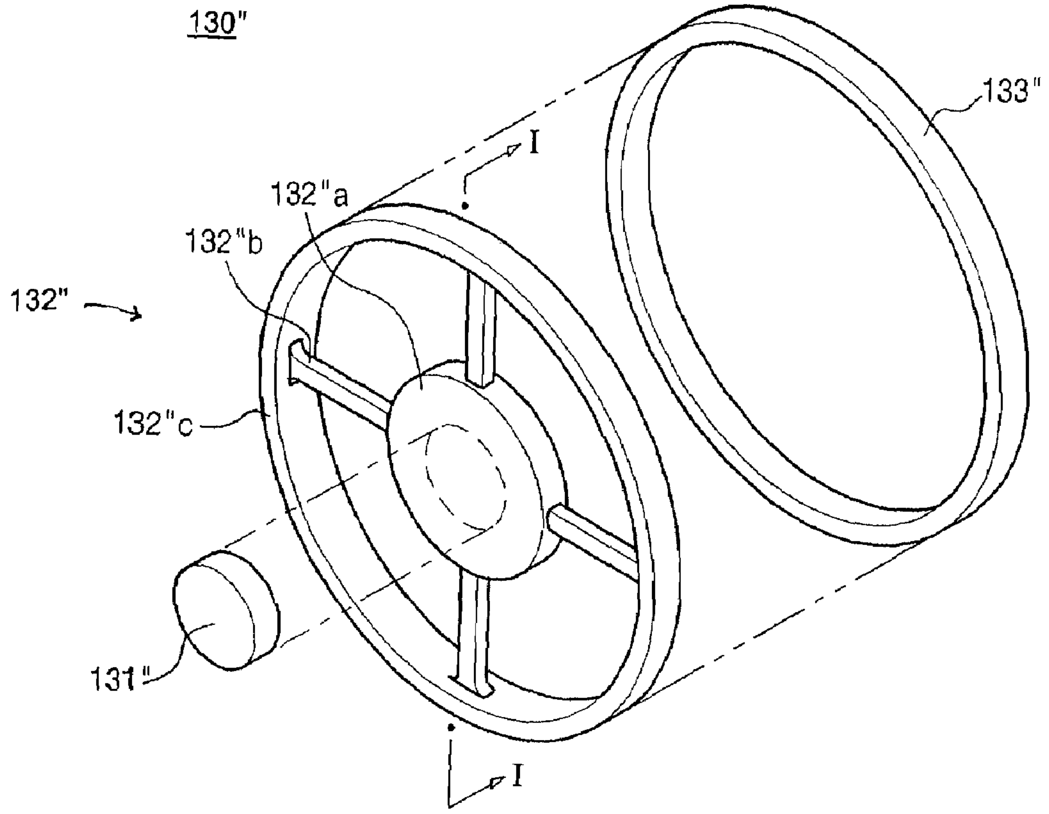
FIG. 6*a* is a schematic perspective view illustrating another connecting portion according to the present invention.
Figure 6B:
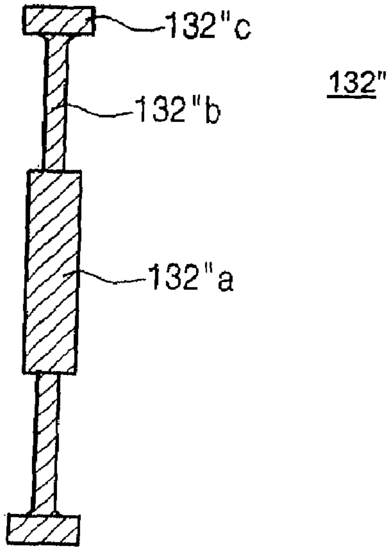
FIG. 6*b* is a partial cross-sectional view taken along the line I-I of FIG. 6*a;*

FIG. 6*a* is a schematic perspective view illustrating another example of the connecting portion according to the present invention, and FIG. 6*b* is a partial cross-sectional view taken along the line I-I of FIG. 6*a*.

In FIGS. 6*a* and 6*b*, another example of the connection portion is shown with reference to the piezoelectric element portion including a plurality of piezoelectric elements, but is not limited thereto. The connection portion may be mounted at the piezoelectric element portion including a single piezoelectric element and it can be variously modified.

The connection portion 130" includes a contact part 131", a support part 132" and a mounting part 133". The contact part 131" is formed in a coin shape, and is attached at one side thereof to a non-free end of the piezoelectric element portion 120' (see FIG. 5) and is attached at the other side thereof to the support part 132". The support part 132" is formed in a wheel shape and includes a hub 132"*a* positioned at the center thereof, an outer rim 132"*c* concentric with the hub, and a plurality of spokes 132"*b* arranged radially around the hub in such a fashion that opposite ends of each spoke are secured to the hub and the rim, respectively, for connecting the hub 132"*a* and the outer rim 132"*c* to each other. The support part 132" may be formed to a thickness of 0.1 mm or so through a microelectric mechanical system (MEMS).

Here, the central hub 132"*a* abuts against the other side of the contact part 131" and the outer rim 132"*c* abuts against the mounting part 133". Design specifications such as the thickness, length of the hub 132"*a*, the outer rim 132"*c*, particularly the spokes 132"*b* are adequately selected to adjust the characteristic of the vibration frequency, so that it is also possible to implement a piezoelectric type vibrator having an optimum vibration effect in the audible frequency range of a user.

While each of the aforementioned embodiments has been described with reference to a piezoelectric type vibrator adopting a closed type housing of which both sides located at the auditory ossicle are closed, the arrangement position of the piezoelectric type vibrator and the shape of the housing according to the present invention are not restricted to this but is also applicable to a piezoelectric type vibrator of a structure which has a housing opened at one side thereof and in which the free end of the piezoelectric element portion is disposed at the inner ear.

Figure 7A:
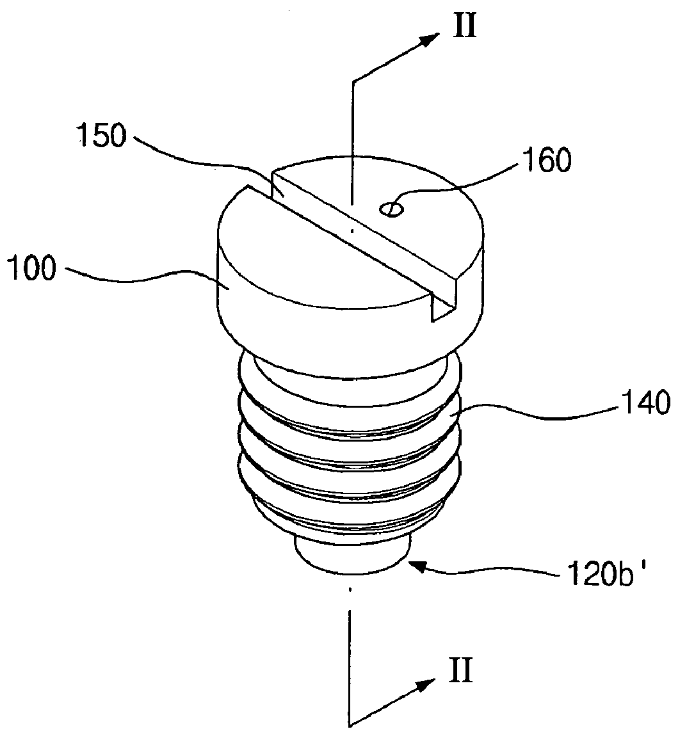
FIG. 7*a* is a is a schematic perspective view illustrating a piezoelectric type vibrator for the implantable middle ear hearing device according to a fourth embodiment of the present invention.
Figure 7B:
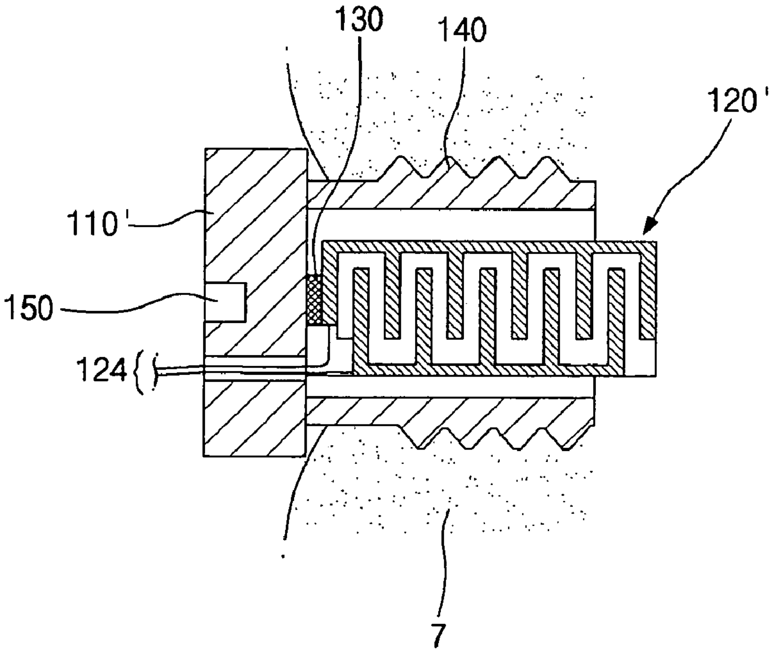
FIG. 7*b* is a schematic cross-sectional view taken along the line II-II of FIG. 7*a;*

FIG. 7*a* is a is a schematic perspective view illustrating a piezoelectric type vibrator for the implantable hearing device according to a fourth embodiment of the present invention and FIG. 7*b* is a schematic cross-sectional view taken along the line II-II of FIG. 7*a*.

As shown in FIGS. 7*a* and 7*b*, a piezoelectric type vibrator 100 according to a fourth embodiment of the present invention includes a housing 110', a piezoelectric element portion 120' and a connection portion 130. Here, the piezoelectric element portion and the connection portion according to each of the aforementioned embodiments can be used for the piezoelectric element portion 120' and the connection portion 130. The detailed description of the piezoelectric element portion, the connection portion as well as the controller 5 and the microphone 4 connected with the piezoelectric type vibrator 100 will be omitted. In addition, the piezoelectric type vibrator 100 has been described, focusing on the connection portion 130 in order to provide the optimum acoustic characteristics, but it is possible to exclude the connection 130 in the case where responsibility and efficiency of vibration transmission are needed to be improved.

The housing 110' is formed in a cylindrical shape, and is opened at one side thereof. The housing is formed at least partially on the circumferential surface thereof with an engagement member 140 for securing the housing 110' to a round window 7 of a cochlear duct 6 (see FIGS. 8*a* and 8*b*). In FIGS. 7*a* and 7*b*, the engagement member 7 is shown as screw threads formed on the outer circumferential surface of the housing 110'. The screw threads are preferably formed in proper numbers, for example, to be less than five in number in order to ensure that the housing 110' is securely fixed to the round window 7 and the damage of the surrounding portions of the housing is minimized. The engagement member 140 of a screw-thread shape has advantages in that it is excellent in bondability, separation of the housing 110' from the round window due to an external impact is prevented, and its work is simple. However, the engagement member is not limited to such a screw thread shape but can be also formed in various shapes like a wedge shape, etc., as long as it is formed on the outer circumference of the housing.

The housing 110' may further have a groove 150 formed on the outer surface of a closed side thereof. The groove 150 is formed on the outer surface of the closed side thereof in such a fashion as to traverse the axial center of the housing 110'. Specifically, in the case where the engagement member 140 is formed in a screw thread shape, the groove 150 acts as a groove for a driver so that the housing 110' of the piezoelectric type vibrator 100 can be more easily mounted to the round window 7 of the cochlear. In addition, the housing may have a lead wire through-hole 160 formed on the outer surface of the closed side thereof for passing a lead wire 124 therethrough, which is connected at one end thereof to electrodes of the piezoelectric element portion 120' and at the other end thereof to the controller 5 (see FIG. 2*a*).

At the inside of the housing 110" is disposed a connection portion 130 which is attached at one end thereof to one side of the inner wall of housing and at the other end thereof to one end of the piezoelectric element portion 120' so that the one end of the piezoelectric element portion 120' defines a non-free end thereof. The other end 120*b'* of the piezoelectric element portion 120' forms a free end so that it protrudes outwardly from the opened one side of the housing 110'.

A process of mounting the piezoelectric type vibrator 100 according to the fourth embodiment of the present invention will be described hereinafter.

In this embodiment, the engagement member 140 exemplifies a screw thread shaped one.

Figure 8A:
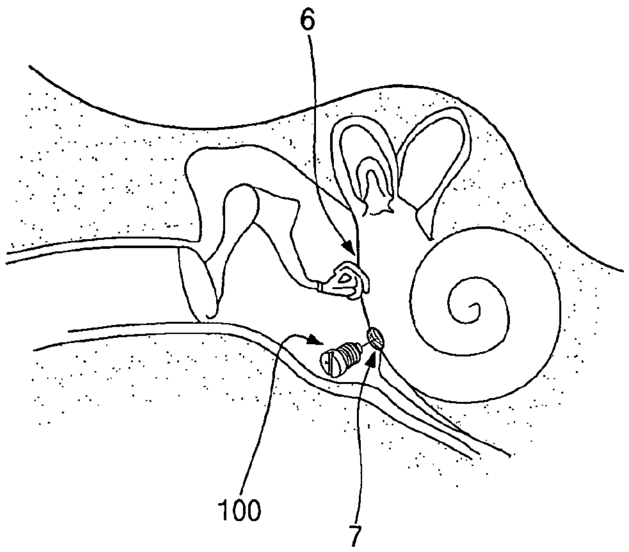
FIG. 8*a* is a schematic perspective view illustrating an arrangement state in which the piezoelectric type vibrator is embedded in the inner ear according the fourth embodiment of the present invention.
Figure 8B:
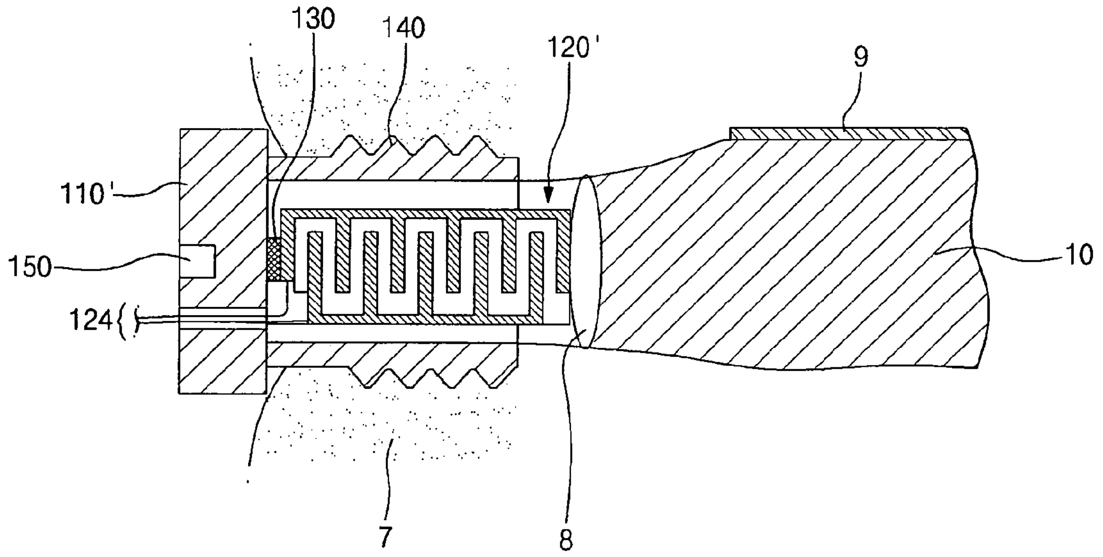
FIG. 8*b* is a schematic cross-sectional view illustrating an inner ear portion in which the piezoelectric type vibrator is embedded according the fourth embodiment of the present invention.

FIG. 8*a* is a schematic perspective view illustrating an arrangement state in which the piezoelectric type vibrator is embedded in the inner ear according the fourth embodiment of the present invention, and FIG. 8*b* is a schematic cross-sectional view illustrating an inner ear portion in which the piezoelectric type vibrator is embedded according the fourth embodiment of the present invention.

As shown in FIG. 8*a*, a mounting hole is formed at the round window 7 of the cochlear 6. In order to ensure that the housing 110' is securely fixed to the round window and damage of the round window 7 is minimized, the diameter of the mounting hole 8 must be appropriately selected, and is preferably approximately 2.5 mm.

Thereafter, the piezoelectric-type vibrator 100 including the housing 110', the piezoelectric element portion 120' and the connection portion 130 is provided, and is disposed at an inlet of the round window 7 of the cochlear 6. At this time, the opened one side of the housing 110' is oriented toward the inlet of the round window 7.

Then, by the cooperative operation between a driver and the groove 150 formed on the outer surface of the closed side of the housing, the housing 110' of the piezoelectric-type vibrator 100 is inserted into the round window 7.

In this case, it is checked by using the piezoelectric element portion 120' whether or not the piezoelectric-type vibrator 100 is stably and accurately mounted to the round window 7. That is, in the case where the piezoelectric-type vibrator 100 is inserted into the round window 7, one end of the piezoelectric element portion 120' is positioned at the foremost point in an insertion direction of the piezoelectric element portion. When pressure is exerted to the piezoelectric element portion 120' due to the contact with the round window membrane 8 in terms of the physical property of the piezoelectric element portion 120' an electrical signal is applied to the round window membrane 8 correspondingly. At this time, when the free end of the piezoelectric element portion 120' comes into close contact with the round window membrane 8 located inside the round window 7, an electrical fluctuation signal transmitted to the round window membrane 8 from the piezoelectric element portion 120' through the lead wire 124 is checked by a detection means such as an oscilloscope to identify whether the piezoelectric-type vibrator 100 is properly inserted into the round window 7. That is, when an electrical fluctuation signal value from the piezoelectric element portion 120' detected by the detection means (not shown) reaches a preset value, it can be identified that the piezoelectric-type vibrator 100 has been smoothly mounted to the round window 7. In this case, the contact between the round window membrane 8 and the piezoelectric element portion 120' is carried out only to an extent of transmitting a vibration from the piezoelectric element portion 120' to the round window membrane 8, but is not carried out to an extent of restricting the behavior of the free end of the piezoelectric element portion 120'. That is, the above-mentioned structure of the piezoelectric-type vibrator is simple and has a high efficiency exhibited by vibrators having two non-free ends. Also, it is possible to properly select the material of the connection portion to thereby control a desired frequency property.

The operation of the piezoelectric-type vibrator according to the fourth embodiment of the present invention will be described hereinafter.

The electrical signal generated from the microphone 4 (see FIG. 2*a*) mounted at the tympanic bone of a user and the controller 5 allows the piezoelectric element of the piezoelectric element portion 120' to be expanded and/or contracted. Such a volume change of the piezoelectric element causes vibration to be directly delivered to the round window membrane 8. The vibration delivered to the round window membrane 8 causes waves be generated from lymph 10 filled in a tympanic canal and a vestibular canal to move a basilar membrane 9 within the cochlear so that the basilar membrane 9 stimulates the auditory nerve cells (not shown), and then a stimulus signal for the external sound is transmitted to the user's brain to thereby recognize the sound. In a normal ear, acoustic vibration transmitted into an oval window vibrates the lymph, and its remaining minute vibration after vibration reaches the round window side through a helicotrema of a distal end of the cochlear so that it is discharged into the cavity of the middle ear. Like the fourth embodiment of the present invention, when a vibrator for driving the round window membrane interrupts the inlet of the round window membrane, minute vibration remaining after acoustic vibration transmitted into an oval window is absorbed by a flexible connection portion within the vibrator, and hence does not affect the vibrator any more. Further, the piezoelectric type vibrator of such a structure is spaced far apart from the microphone disposed at the tympanic bone, and howling phenomenon is significantly reduced due to the damping effect of lymph as well as vibration energy is directly transmitted to the lymph through the round window membrane so that audibility of profoundly deaf individuals is improved.

While the aforementioned embodiments has been described with reference to the piezoelectric type vibrator and the implantable hearing device including the piezoelectric type vibrator, they are intended merely for explanation of the present invention and the present invention is not restricted to these embodiments. The piezoelectric element portion may include a plurality of piezoelectric elements which are connected with one another in parallel, but are not connected with one another in series. Depending on the occasion, the materials constituting the piezoelectric elements may be selected differently. Also, the piezoelectric type vibrator may be located at the auditory ossicle as well as at the round window. In addition, the housing may include a housing body and a housing cover configured such that the housing body and the housing cover are engaged with each other in such a fashion that protrusions formed on one end of the outer surface of the housing body are snap-fit into concave depressions formed on the inner surface of the housing cover to correspond to the protrusions of the housing body. The housing may be formed in a shape opened at one side thereof so that one end of the piezoelectric element portion protrudes outwardly. It is also possible to variously modify the piezoelectric type vibrator in such a fashion that only one end of the piezoelectric element portion is attached to the housing through the connection portion.

The present invention having the above construction can accomplish advantageous effect as follows:

First, vibration efficiency of the inventive piezoelectric type vibrator is greatly improved as compared to the conventional electromagnetic-transducer type vibrator having a coil and magnets. Particularly, a problem indispensably involved in the case where the conventional piezoelectric type vibrator is implanted into a user's body, i.e., a need for the surgical operation is eliminated in which the vibrator must be securely mounted at the tympanic bone side in the middle ear. Therefore, it is possible to implement a piezoelectric type vibrator and an implantable hearing device having the piezoelectric type vibrator of a structure in which superior vibration effect is achieved, stability of its mounting is secured and a physical burden of the user can be removed or relieved.

Second, the piezoelectric elements included in the piezoelectric element portion are formed in a stacked structure so that when the same voltage is applied thereto, greater displacement can be induced as compared to a unitary piezoelectric element having the same length. Therefore, it is also possible to implement a piezoelectric type vibrator and an implantable hearing device having the piezoelectric type vibrator of a structure in which the entire dimension of the piezoelectric type vibrator is significantly reduced. Through such a piezoelectric type vibrator and an implantable hearing device having the same, the mass of a mass body included in the piezoelectric type vibrator can be decreased so that it is possible to minimize a deformation of the bodily region such as auditory ossicle within the human body where the piezoelectric type vibrator is embedded and to prevent a distortion of the preset frequency property from occurring.

Third, the inventive piezoelectric type vibrator has a greatly simplified structure as compared to the conventional vibrator so that the number of components is decreased and the manufacturing process is simplified to thereby significantly save the manufacturing cost.

Fourth, the piezoelectric type vibrator can be located at the auditory ossicle in the middle ear as well as at the round window of the cochlear so that the opportunity of hearing the sound is more widely provided to severe hearing impairment individuals.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A piezoelectric type vibrator comprising:

a housing configured for mounting at an auditory ossicle of a middle ear;

a piezoelectric element portion having a free end and an opposite non-free end;

the piezoelectric element portion having a first electrode defining the free end and a second electrode; and the non-free end of the piezoelectric element portion connected to an inner wall of the housing such that the piezoelectric element portion is at least partially disposed inside the housing whereby the application of an electrical signal to the first and second electrodes drives the piezoelectric element portion to generate a vibration which is transferred to the housing.

2. The piezoelectric type vibrator of claim 1 further comprising:

a connection portion disposed between the non-free end of the piezoelectric element portion and the inner wall of the housing.

3. The piezoelectric type vibrator set forth in claim 2, wherein the piezoelectric element portion includes at least two piezoelectric elements.

4. The piezoelectric type vibrator set forth in claim 3, wherein the piezoelectric elements are connected with one another in series, and electrodes connected to both ends of the respective piezoelectric elements adopt a parallel connect structure.

5. The piezoelectric type vibrator set forth in claim 2, wherein the connection portion comprises an elastic member.

6. The piezoelectric type vibrator set forth in claim 2, wherein the connection portion comprises a contact part attached to the non-free end of the piezoelectric element portion, a mounting part attached to one side of the inner wall of the housing, and a support part for and connecting and supporting contact part and the mounting part.

7. The piezoelectric type vibrator set forth in claim 6, wherein at least one of the contact part, the mounting part and the support part comprises an elastic member.

8. The piezoelectric type vibrator set forth in claim 6, wherein the support part comprises a hub connected at one side thereof to the contact part, an outer rim concentric with the hub and connected to the mounting part attached to one side of inner wall of the housing, and a plurality of spokes arranged radially around the hub in such a fashion that opposite ends of each spoke are secured to the hub and the rim, respectively, for supportably connecting the hub and the outer rim to each other.

9. The piezoelectric type vibrator of claim 1 wherein the housing is opened at one side thereof and formed at least partially on the circumferential surface thereof with an engagement member and the free end of the piezoelectric element portion protrudes outwardly from the opened side of the housing.

10. The piezoelectric type vibrator set forth in claim 9, further comprising a connection portion interposed between the housing and the piezoelectric element portion, wherein the connection portion is attached at one thereof to one side of the inner wall of housing and at the other end thereof to a non-free end of the piezoelectric element portion.

11. The piezoelectric type vibrator set forth in claim 10, wherein the piezoelectric element portion includes one or more piezoelectric elements.

12. The piezoelectric type vibrator set forth in claim 11, wherein the piezoelectric elements are connected with one another in series, and electrodes connected to both ends of the respective piezoelectric elements adopt a parallel connect structure.

13. The piezoelectric type vibrator set forth in claim 10, wherein the connection portion comprises a contact part attached to the non-free end of the piezoelectric element portion, a mounting part attached to one side of the inner wall of the housing, and a support part for and connecting and supporting contact part and the mounting part.

14. The piezoelectric type vibrator set forth in claim 13, wherein at least one of the contact part, the mounting part and support part comprises an elastic member.

15. The piezoelectric type vibrator set forth in claim 13, wherein the support part comprises a hub connected at one side thereof to the contact part, an outer rim concentric with the hub and connected to the mounting part attached to one side of the inner wall of the housing, and a plurality of spokes arranged radially around the hub in such a fashion that opposite ends of each spoke are secured to the hub and the rim, respectively, for supportably connecting the hub and the outer rim to each other.

16. The piezoelectric type vibrator set forth in claim 10, wherein the housing is disposed at a round window of a cochlear, and a free end of the piezoelectric element portion abuts against a round window membrane.

17. The piezoelectric type vibrator set forth in claim 10, wherein the housing further has a groove formed on the outer surface of a closed side thereof in such a fashion as to traverse the axial center of the housing.

18. The piezoelectric type vibrator set forth in claim 1 wherein:

the first electrode includes an electric coupling to a first terminal at the free end of the piezoelectric element portion;

the second electrode defines the non-free end of the piezoelectric element portion and includes an electric coupling to a second terminal at the non-free end of the piezoelectric element portion; and the piezoelectric element portion includes a piezoelectric element disposed between the first and second electrodes.

19. An implantable hearing device comprising:

a microphone disposed at a tympanic bone for receiving acoustic signal from the outside;

a controller for receiving the acoustic signal from the microphone to convert the received acoustic signal into an acoustic electrical signal to generate a control signal; and a piezoelectric type vibrator comprising:

a housing configured for mounting at an auditory ossicle of a middle ear:

a piezoelectric element portion having a free end and an opposite non-free end;

the piezoelectric element portion having a first electrode defining the free end and a second electrode; and the non-free end of the piezoelectric element portion connected to an inner wall of the housing such that the piezoelectric element portion is at least partially disposed inside the housing whereby the application of an electrical signal to the first and second electrodes drives the piezoelectric element portion to generate a vibration which is transferred to the housing.

* * * * *